US011125632B2

(12) United States Patent
Rey et al.

(10) Patent No.: US 11,125,632 B2
(45) Date of Patent: Sep. 21, 2021

(54) PIEZORESISTIVE DETECTION RESONANT DEVICE IN PARTICULAR WITH LARGE VIBRATION AMPLITUDE

(71) Applicants: Commissariat a L'Energie Atomique et aux Energies Alternatives, Paris (FR); POLITECNICO DI MILANO, Milan (IT)

(72) Inventors: Patrice Rey, St Jean de Moirans (FR); Guillaume Jourdan, Grenoble (FR); Philippe Robert, Grenoble (FR); Giacomo Langfelder, Milan (IT); Antonio F Longoni, Milan (IT); Stefano Dellea, Milan (IT)

(73) Assignees: Commissariat a L'Energie Atomique et aux Energies Alternatives, Paris (FR); POLITECNICO DI MILANO, Milan (IT)

(*) Notice: Subject to any disclaimer, the term of this patent is extended or adjusted under 35 U.S.C. 154(b) by 285 days.

(21) Appl. No.: 15/248,756

(22) Filed: Aug. 26, 2016

(65) Prior Publication Data
US 2017/0059420 A1 Mar. 2, 2017

(30) Foreign Application Priority Data

Aug. 31, 2015 (EP) .................................... 15306336

(51) Int. Cl.
*B81B 7/00* (2006.01)
*G01P 15/12* (2006.01)
(Continued)

(52) U.S. Cl.
CPC .......... *G01L 1/183* (2013.01); *G01C 19/5607* (2013.01); *G01C 19/5755* (2013.01);
(Continued)

(58) Field of Classification Search
None
See application file for complete search history.

(56) References Cited

U.S. PATENT DOCUMENTS 4,221,131 A * 9/1980 Albert ................. G01P 15/0802
73/514.29
8,156,807 B2 4/2012 Robert
(Continued)

FOREIGN PATENT DOCUMENTS

EP 2 211 143 A1 7/2010
EP 2 520 900 A1 11/2012

OTHER PUBLICATIONS

European Search Report dated Feb. 24, 2016 in European Application 15306336.7 filed on Aug. 31, 2015.
(Continued)

*Primary Examiner* — Jill E Culler
*Assistant Examiner* — Ruben C Parco, Jr.
(74) *Attorney, Agent, or Firm* — Oblon, McClelland, Maier & Neustadt, L.L.P.

(57) ABSTRACT

Piezoresistive detection resonant device comprising a substrate, a mobile par configured to move with respect the substrate, suspension elements suspending the mobile part to the substrate, a piezoresistive detection device to detect the motions of the mobile part, said piezoresistive detection device comprising at least one strain gauge, wherein the piezoresistive detection resonant device also comprises a folded spring with at least two spring arms, connected to the mobile part and configured to be deformed by the motion of the mobile part, the at least one gauge being suspended between the substrate and the folded spring in such manner that the deformation of the gauge is reduced compared to the motion of the mobile part.

10 Claims, 10 Drawing Sheets

(51) Int. Cl.
*G01L 1/18* (2006.01)
*G01C 19/5755* (2012.01)
*G01C 19/5607* (2012.01)
*G01P 15/08* (2006.01)

(52) U.S. Cl.
CPC .......... *G01P 15/123* (2013.01); *B81B 7/0016* (2013.01); *G01P 2015/0814* (2013.01); *G01P 2015/0817* (2013.01); *G01P 2015/0857* (2013.01)

(56) References Cited

U.S. PATENT DOCUMENTS

| | | | | |
|---|---|---|---|---|
| 2008/0314148 | A1* | 12/2008 | Robert | B81B 3/0086 73/514.33 |
| 2010/0186506 | A1* | 7/2010 | Robert | G01C 19/574 73/504.12 |
| 2011/0219875 | A1* | 9/2011 | Walther | B81B 3/0051 73/514.29 |
| 2012/0031183 | A1 | 2/2012 | Neul et al. | |
| 2012/0132003 | A1* | 5/2012 | Comi | G01P 15/0888 73/514.29 |
| 2012/0210792 | A1 | 8/2012 | Robert et al. | |
| 2014/0090468 | A1* | 4/2014 | Fu | G01P 15/125 73/504.08 |
| 2014/0245832 | A1* | 9/2014 | Lin | G01P 15/125 73/514.35 |
| 2015/0013455 | A1 | 1/2015 | Deimerly | |

OTHER PUBLICATIONS

M. Aikele, et al., "Resonant accelerometer with self-test", Sensors and Actuators A92, 2001, 7 pgs.

Dazhong Jin, et al., "High-mode resonant piezoresistive cantilever sensors for tens-femtogram resoluble mass sensing in air", Journal of Micromechanics and Microengineering, 2006, 8 pgs.

* cited by examiner

FIG.1

Background Art

PIEZORESISTIVE DETECTION RESONANT DEVICE IN PARTICULAR WITH LARGE VIBRATION AMPLITUDE

TECHNICAL FIELD AND PRIOR ART

The present invention relates to a piezoresistive detection resonant device having possibly large vibration amplitude, for example such a resonant device can be implemented in an accelerometer or a gyrometer.

A resonator generally comprises a deformable part which is excited at its resonance frequency through thermal, electrostatic, magnetic or piezoelectric means. Mechanical vibrations are converted into an electrical signal by means of electrostatic, magnetic, piezoelectric or piezoresistive means. This signal is picked up and enables close loop operation to adjust the excitation to the target value.

An example of resonator included in an accelerometer is given in Aikele, K. Bauer, W. Fisher, F. Neubauer, U. Prechtel, J. Schalk and H. Seidel—Resonant accelerometer with self test—Sensors and Actuators A92, 2001, pp 161 to 167. The accelerometer is thermally actuated and the frequency shift is detected with a piezoresistor. A mass detector comprising a resonator with magnetic excitation and piezoresistive detection is described in Dazhonh Jin et al—*High-mode resonant piezoresistive cantilever sensors for tens-femtogram resoluble mass sensing in air*—Journal of Micromechanics and Microengineering—2006, 16, pp 1017-1023].

Document U.S. Pat. No. 8,156,807 describes resonator with strain gauges for detecting the vibrations of the resonator. The vibration amplitude of the resonator is small and the strain gauges are located at a reasonable distance from the anchorage of the beam where they are submitted to a convenient elongation.

But, in some cases, the amplitude of vibration is very large. It is then not so easy to have piezoresistive detection with suspended nanogauges because the large vibration amplitude has to be reduced to be compatible with the elongation a nanogauge is able to withstand. Generally, a capacitive detection is preferred. In capacitive detection devices, at least one electrode is secured to the resonator and at least one electrode is fixed to the substrate. When the resonator vibrates the gap between the electrodes change and a variation of capacitance is measured.

Figure 1:
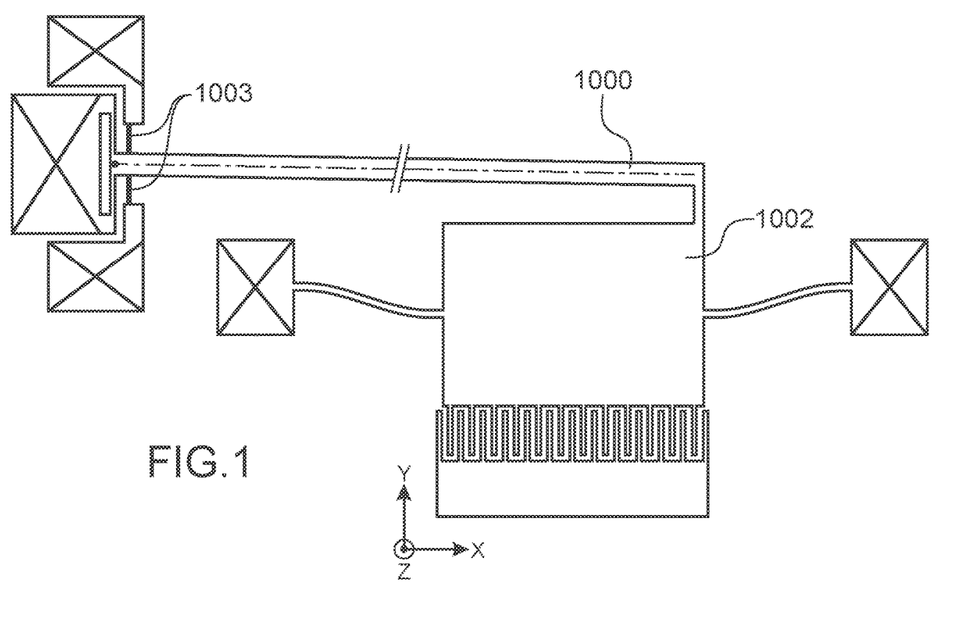
FIG. 1 is a schematic representation of the top view of a piezoresistive detection resonant device of the state of the art

This is the case, for example, for vibrating MEMS gyroscope where the mechanical element is formed by a drive section and a sense section and where the drive section is a closed loop resonator formed by actuation means and detection means. The driving section (drive resonator) is used to keep a suspended frame in oscillation. The sensing section is used to measure the effects of Coriolis forces. The sensitivity of a gyroscope is proportional to the drive mode displacement. As a consequence, relatively large displacements (e.g. a few µm to a few tens of µm) are expected for good performance. The detection of such large displacement is performed through the surface variation of capacitive electrodes typically in the comb-finger configuration. An example of such an implementation is given in FIG. 1.

A device using strain gauges exists. An example of such a device is shown on FIG. 1. It comprises a lever arm 1000 connected to the mass 1002 and to gauges 1003 to reduce the elongation applied to the gauges 1003. But, for large displacements, the lever arm 1000 must be very long to be efficient and takes up a lot of room which could be a problem for consumer devices that must be very cheap and, consequently, very small.

Using a small lever system would imply to position the gauge too close to the rotation point, which is not feasible for process and repeatability issues. Further, there would be issues related to buckling, fracture or fatigue caused by the too large stress on the gauge.

DISCLOSURE OF THE INVENTION

Consequently one purpose of the present invention is to provide a resonator with large vibration amplitude detected by piezoresistive detection which has not the disadvantages mentioned here-above.

The previously set forth purpose is achieved by a piezoresistive detection resonator comprising a mass suspended to a substrate by suspension means, said mass being configured to vibrate, at least one piezoresistive gauge to detect the vibrations of the mass, at least one spring connected to the mass and to the substrate, the piezoresistive gauge being suspended between the spring and the substrate.

Thanks to the implementation of at least one spring, elongation of the piezoresistive gauge is reduced compared with the vibration amplitude. Therefore a piezoresistive detection resonator having high vibration amplitude can be achieved.

The spring is configured to limit the amplitude deformation of the at least one gauge under a threshold elongation. Preferably the threshold elongation $\Delta l/l$ is about $5 \cdot 10^{-4}$ where $l$ is the greatest dimension of the gauge at rest and $\Delta l$ is the variation of this greatest dimension deformed by the motion of the mobile part.

The spring is advantageously a folded spring between the piezoresistive gauge and the mass, In others words, the invention used means which transmit vibrations to the piezoresistive gauge with reduced amplitude.

In one embodiment the resonator comprises a rigid beam which is able to rotate with respect to the substrate about an axis perpendicular to the plane of the substrate. The mass is connected to the beam through the elastic deformable means and the piezoresistive gauge is suspended between the rigid beam and the substrate.

Very advantageously the resonator comprises two piezoresistive gauges allowing a differential readout.

The resonator can comprise excitation means to actuate the resonator, the excitation means can be electrostatic means.

The resonator can be used to manufacture an accelerometer or a gyrometer.

This invention can be applied to any sensor using a piezoresistive resonant detection and especially where the sensitive element is a suspended gauge requiring a very small elongation with respect to the amplitude of the resonating structure.

Such sensors can be a pressure sensor, a gas sensor, a force sensor, micro-mirrors etc.

The subject-matter of the invention is a piezoresistive detection resonant device comprising a substrate, a mobile part configured to move with respect the substrate, suspension means suspending the mobile part to the substrate, a piezoresistive detection device to detect the motions of the mobile part, said piezoresistive detection device comprising at least one strain gauge, wherein the piezoresistive detection resonant device also comprises at least one first elastic deformable element connected to the mobile part and configured to be deformed by the motion of the mobile part, the at least one gauge being suspended between the substrate and the first elastic deformable element.

The first elastic deformable element is preferably configured to limit the deformation amplitude of the at least one gauge under a threshold elongation.

The first elastic deformable element can comprise at least one spring, and advantageously comprises n spring arms, n≥1 and is advantageously is a folded spring.

In one example, the at least one gauge is directly connected to the substrate.

The at least one gauge can be directly connected to the first elastic deformable element.

In one example, the first elastic deformable element is both connected to the substrate and to the mobile part through pivot links, the gauge being directly connected to the elastic deformable element.

In one example, the piezoresistive detection resonant device comprises a rigid beam configured to pivot with respect to the substrate, the at least one gauge being directly connected to the rigid beam and to the substrate and the first elastic deformable element being directly connected to the rigid beam.

The mobile part can be configured to move in a plane of the device, the rigid beam being able to rotate about an axis perpendicular to the plane of the device. For example, the piezoresistive detection resonant device comprises at least one second elastic deformable element connected to the rigid beam and to the substrate limiting out-of-plane motions of the rigid beam.

In another example, the piezoresistive detection resonant device comprise a rigid beam configured to pivot with respect to the substrate, the at least one gauge being directly connected to the rigid beam and to the substrate and the first elastic deformable element being directly connected to the rigid beam, and wherein the mobile part is configured to have out-of-plane motions, the rigid beam being able to rotate about an axis parallel to the plane of the device. The piezoresistive detection resonant device can comprise at least one second elastic deformable element connected to the rigid beam (116) and to the substrate, said second elastic deformable element limiting in-plane motions of the rigid beam.

According to one example, the at least one spring comprises at least three arms, a second gauge being suspended to two arms and a third gauge being suspended to one of arm to which the second gauge is attached and to the other arm.

According to another example, the at least one spring comprises at least two arms, one arm being suspended to the substrate through one additional spring and a second gauge being suspended to one arm of the spring and the substrate. The piezoresistive detection resonant device can comprise at least two strain gauges connected in such manner that a differential measurement of the motion of the mobile part is obtained.

The piezoresistive detection resonant device can comprising actuation means for actuating the mobile part, such actuation means may be for example electrostatic means, thermal means, magnetic means or piezoresistive means.

Another subject-matter of the invention is an accelerometer comprising at least one piezoresistive detection resonant device according to invention.

Another subject-matter of the invention is a gyrometer comprising at least one piezoresistive detection resonant device according to the invention.

BRIEF DESCRIPTION OF THE DRAWINGS

The present invention will be better understood using the description that follows and the figures on which.

DETAILED DISCLOSURE OF PARTICULAR EMBODIMENTS

The resonant devices of the invention are microelectromechanical systems (MEMS) and/or nanoelectromechanical systems (NEMS). They extended in a plane defined by axis X and axis Y, axis Z is perpendicular to plane XY.

Figure 2A:
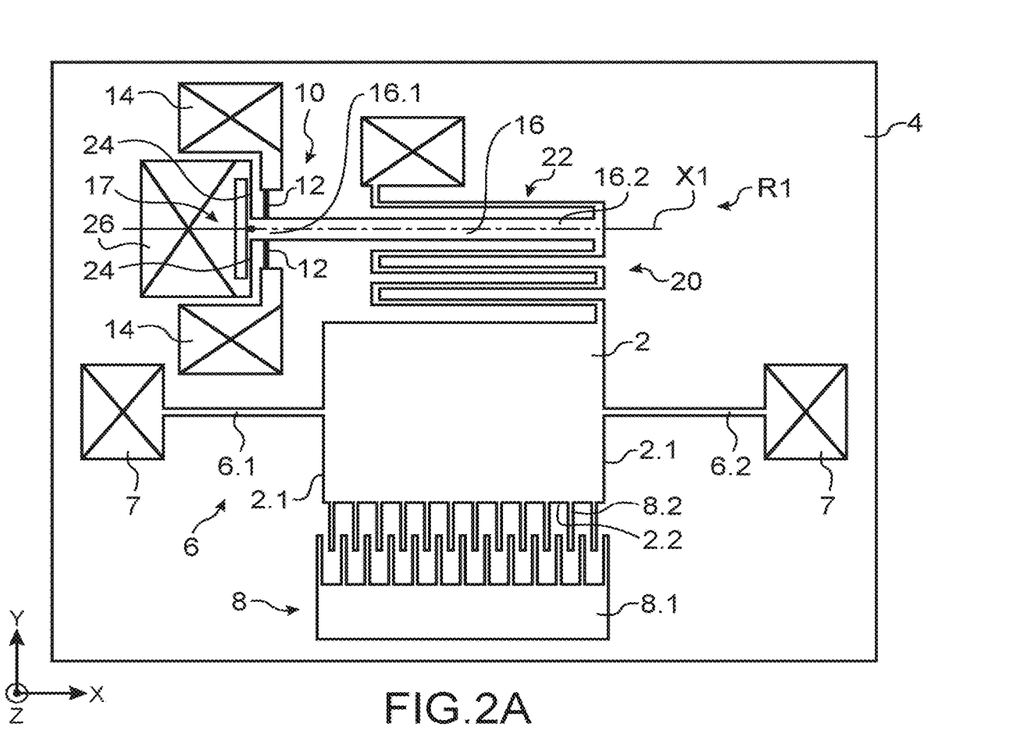
FIG. 2A is a schematic representation of the top view of one embodiment of the resonator in a rest state configured to have in-plane motion.
Figure 2B:
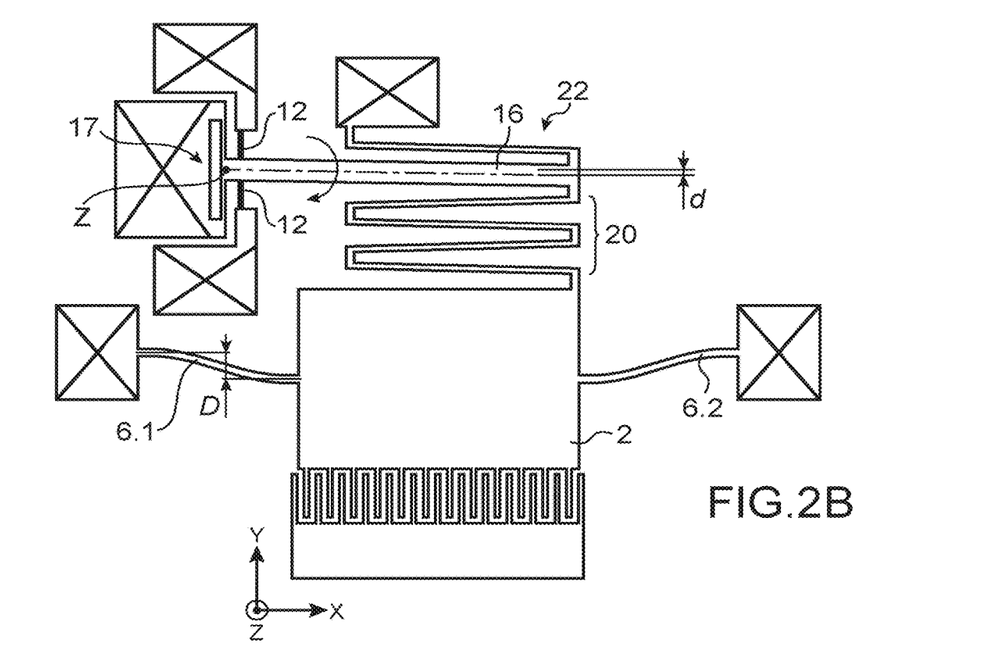
FIG. 2B is the schematic representation of the top view of the resonator of FIG. 2A in vibrating state.
Figure 2C:
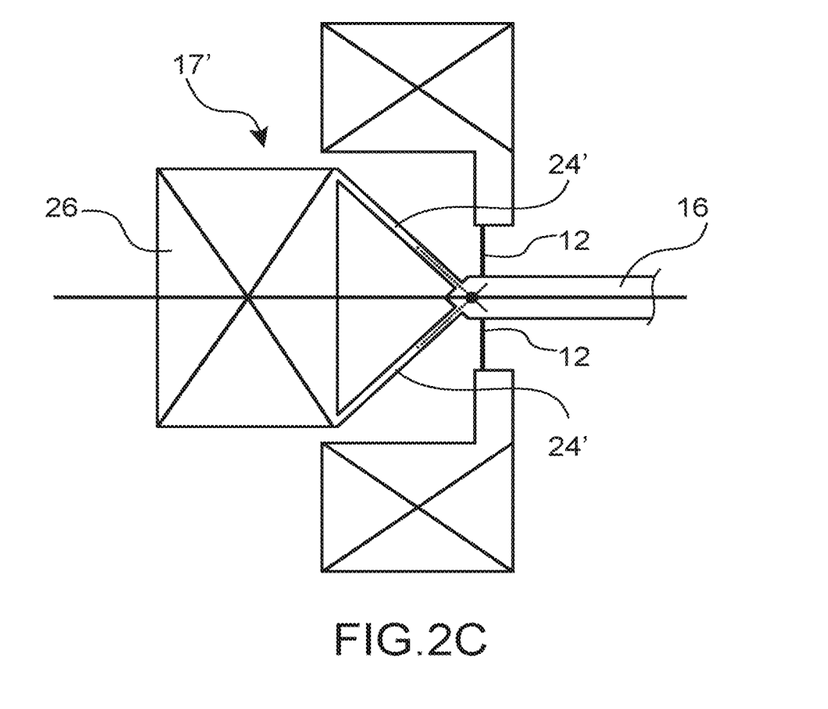
FIG. 2C is a detailed view of variant of the pivot hinge between the rigid beam of the resonator of FIG. 2A and the substrate.
Figure 2D:
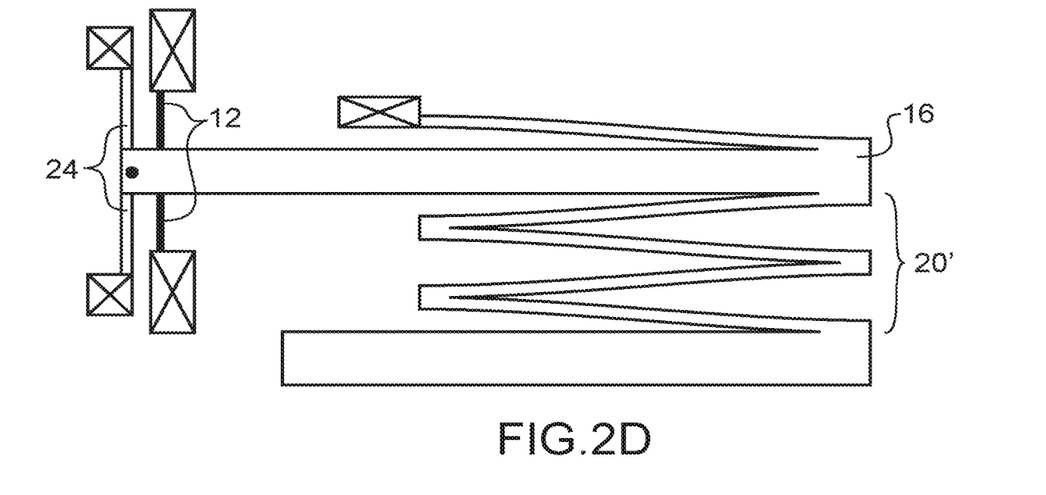
FIG. 2D is a schematic representation of the top view of another example of a resonator in a rest state configured to have in-plane motion, FIG. 3A a schematic representation of the top view of one embodiment of the gyrometer.

In FIGS. 2A to 2C, an embodiment of a resonant device having in-plane motion can be seen. "Resonator" will be used to designate the resonant device.

The resonator R1 comprises a mobile part 2, also called a seismic mass or mass, which is suspended with respect to a substrate 4 with suspension means 6. The suspension means 6 comprise for example arms 6.1, 6.2, each arm extended between one side of the mass 2 and one pad 7 by which it is anchored to the substrate 4. The arms extended from opposite sides of the mass which allows the mass 2 to move in the plane XY.

In this embodiment, the resonator also comprises excitation means 8, also called drive means or actuation means to actuate the resonator along the X-direction. In this embodiment the drive means are of the electrostatic type and comprise one comb 8.1 fixed to the substrate and one comb 8.2 attached to the mass, the combs 8.1 and 8.2 being interdigitated. When a voltage is applied between the combs the mass is moved along Y-axis. The excitation means combined with detection means of the position of the mass along the X-direction form a closed loop resonator to keep the mass in oscillation In the embodiment, the mass is rectangular, the suspension arms extend for the smaller sides 2.1 and the comb 8.2 extends along one of the longer sides 2.2 of the mass. The drive means actuate the mass along the Y-direction.

The resonator also comprises piezoresistive detection means 10 to detect the motion of the resonator due to an external force along the Y-direction.

The piezoresistive detection means 10 comprise at least one strain gauge 12, and preferably two strain gauges 12, which can allow a differential readout. Preferably the gauges are nanoscale, because the strain is concentrated and the sensitivity of the measure is increased.

The strain gauges 12 are suspended between a pad 14 fixed to the substrate and a rigid beam 16. The rigid beam 16 extends along an axis X1 parallel to X-axis and is hinged on the substrate through a pivot hinge 17 about the Z-axis at a first longitudinal end 16. The rigid beam 16 extends along X-axis and is connected to the mass 4 through elastic deformable means.

In the embodiment shown on FIGS. 2A to 8B, the elastic deformable means comprises a spring 20 with n arms n≥2 like a folded spring. The folded spring comprises n spring arms, n≥2, which are connected to each other such that the arms are approximately parallel and one longitudinal end of a spring arm is connected to at least a longitudinal end of a previous spring arm and the other longitudinal end of the spring arm is connected to at least a longitudinal end of a next spring arm.

A device with an elastic deformable spring comprising one arm belongs to the invention.

One free end of the folded spring 20 is connected at the other longitudinal end 16.2 of the beam 16.

Very advantageously, the beam is also anchored to the substrate through additional elastic deformable means, for example a folded spring 22. In the embodiment shown the folded spring 22 comprises one spring arm and the folded spring 20 and the folded spring 22 are both connected to the longitudinal end 16.2 of the beam. The anchorage to the substrate to the folded spring 22 allows the mass to move in the plane and avoid out-of-plane motion of the mass.

In the embodiment shown, the pivot hinge 17 comprises two beams 24 which are able to be deformed in flexure in the plane XY. Each beam 24 is connected to one lateral face of the rigid beam 16 and to an anchorage pad 26. In FIGS. 2A and 2B, the beams 24 are aligned along a direction perpendicular to the axis X1 of the rigid beam.

In FIG. 2C, a variant of a pivot hinge 17' by which the rigid beam is hinged to the substrate 2 is shown. It also comprises two beams 24' able to flex in XY-plane but their axes are secant. This beam configuration advantageously prevents the movement along the X direction and it reduces the movement along the Z direction.

The resonator of FIGS. 2A and 2B operates as follows:

The resonator is actuated electrostatically along Y-axis in the example shown with a voltage applied between the electrodes of the interdigitated fingers; an outer force moves the mass along Y-axis. The in-plane motion of the mass along Y-axis is transmitted to the beam 16 through the folded spring 20, the beam then rotates about Z-axis at its longitudinal end 16.1. One strain gauge is then submitted to a tensile stress and the other gauge is submitted to a compressive stress and a differential readout is provided.

The transmission of the displacement of the mass along Y-axis to the beam 16 depends on the design of the folded spring and on the location of the attachment of the folded spring 20 to the beam 16.

By choosing the mechanical properties of the different elements, mainly the stiffness of the elastic deformable means and of the assembly pivot link—gauges—rigid beam, the reduction of the displacement of the beam at its free end 16.2 can be lower than the displacement of the same beam without the folded spring, as it will shown in the following description.

The elongation of the gauge is also divided in the same manner compared to the elongation of a gauge in resonators of prior art. Conversely with the invention it is possible to have the same elongation of the gauges with a larger displacement of the mass.

In addition the length of the rigid beam can be reduced compared to the length of the arm lever used in the prior art previously cited. The device is then more compact.

As a variant, the elastic deformable means comprise only one arm, the transmission through the arm of the elastic deformable arm reduces the elongation of the gauge compared with the elongation of a gauge in resonators of prior art.

As a variant the excitation means can be electrostatic, piezoelectric, thermal or magnetic means.

The shape of the folded spring is not limited to that shown on FIG. 2A. The spring arms are not necessarily parallel, the folded spring comprises adjacent spring arms forming an angle between them. For example, as shown on FIG. 2D, the folded spring 20' has saw tooth patterns. As a variant the folded spring may have trapezoid patterns.

Figure 3A:
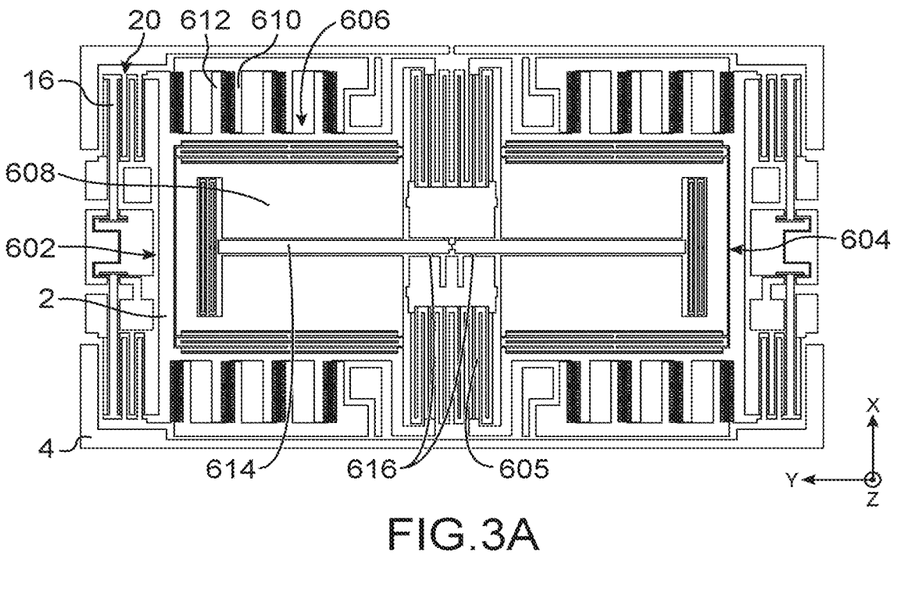
Figure 3B:
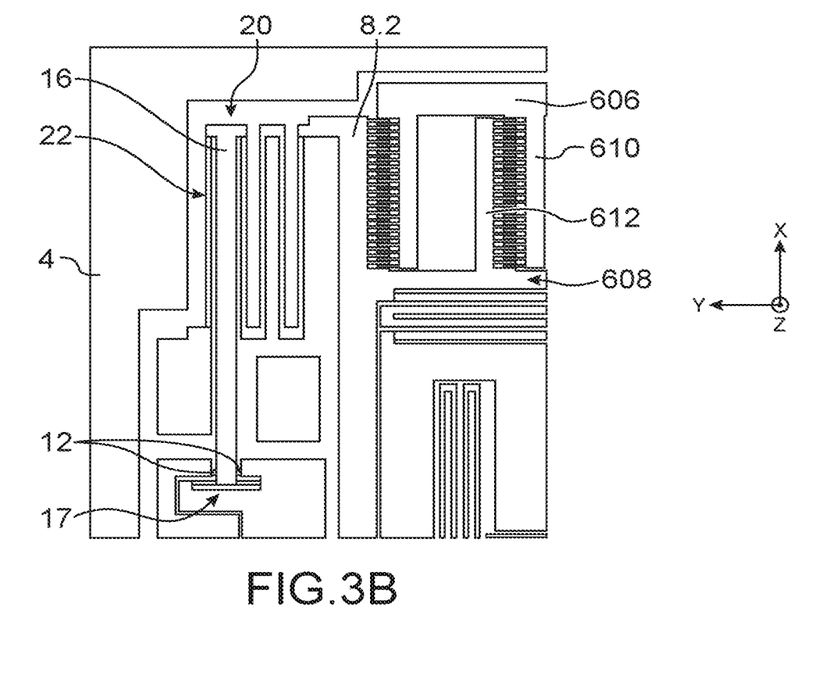
FIG. 3B is a detailed view of the gyrometer of FIG. 3A.

The resonator of FIGS. 2A and 2B can be part of a gyrometer as shown in FIGS. 3A and 3B. In this embodiment the mass 4 has a shape of a frame. In FIGS. 2A and 2B and 3A and 3B, the same reference numbers are used to designate the parts having the same function.

The gyrometer comprises two parts 602 and 604 which are configured to be actuated in opposed phases. The two parts 602 and 604 are connected by springs 605 called Tuning Fork springs. The two parts 602 and 604 have the same structure, only part 602 will be described.

Part 602 comprises an external frame 606 and an inner decoupling frame 608 located inside the external frame. The external frame 606 comprises comb fingers 612 which are interdigitated with comb fingers 610 of the excitation means. Comb fingers performed the drive of the part 602.

An arm 614 is connected to the substrate through a pivot link and to the internal decoupling frames of part 602 and part 604. Piezoresistive gauges 616 are suspended between the arm 614 and the substrate and measure the motion of the arm 614 which allows to determine the Coriolis force.

The gyrometer also comprises an assembly according to the invention. A rigid arm 16 is hinged on the substrate through a pivot hinge 17 and is connected to the external frame through elastic deformable means 20. Gauges 12 are suspended between the rigid arm 16 and the substrate. The detection of the drive displacement by the fingers combs is performed by piezoresistive gauges 12. The elongation of the gauges is reduced.

Figure 4:
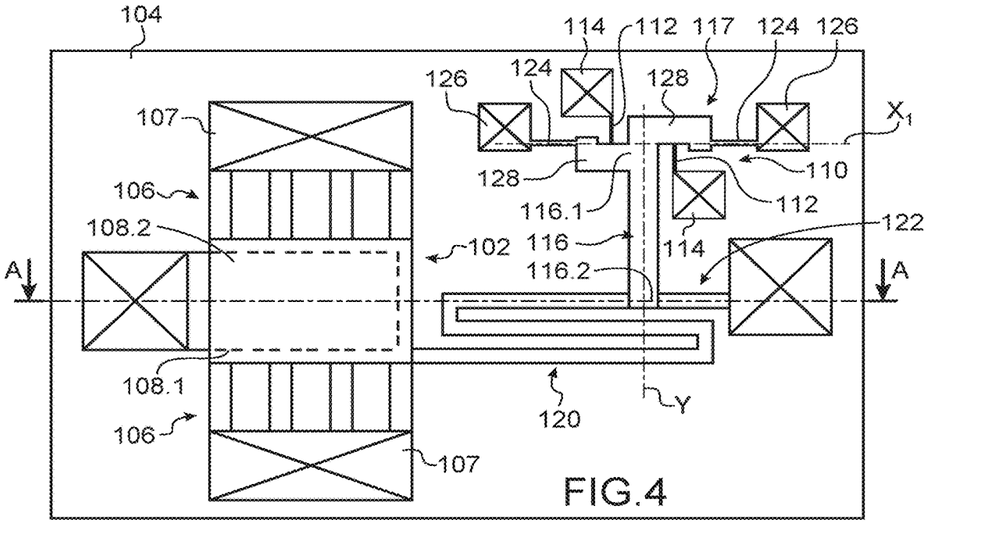
FIG. 4 is a is a schematic representation of the top view of another embodiment of the resonator configured to have out-of-plane motion.

On FIG. 4, a schematic representation of the top view of another embodiment of the resonator configured to have out-of-plane motion is shown.

The resonator R2 comprises a mass 102 which is suspended with respect to a substrate 104 with suspension means 106, and which is able to move out-of-plane. The suspension means 106 comprise at least one arm extended from one side of the mass. In the example shown, the suspension means 106 comprise several arms extended from two opposite sides of the mass. In the embodiment shown, four arms extended between one side of the mass and one pad 107 through which it is anchored to the substrate 104 and four arms extended between the opposite side of the mass and another pad 107 through which it is anchored to the substrate 104.

In this embodiment, the resonator also comprises excitation means 108 also called drive means to actuate the resonator along the Z-direction. In this embodiment the drive means are electrostatic means and comprise one electrode 108.1 on the substrate and one electrode 108.2 on the lower face of the mass facing the electrode 108.1 attached to substrate. When a voltage is applied between the electrodes 108.1 and 108.2, the mass is moved along Z-axis.

The resonator also comprises piezoresistive detection means 110 to detect the motion of the resonator due to an external force.

The piezoresistive detection means 110 comprise at least one strain gauge 112 and preferably two strain gauges 112 which can allow a differential readout.

The strain gauges 112 are suspended between a pad 114 of the substrate and a rigid beam 116. The rigid beam 116 extends along an axis Y1 parallel to Y-axis and is hinged on the substrate through a pivot hinge 117 about the X-axis at a first longitudinal end 116.1.

The rigid beam 116 extends along X-axis and is connected to the mass 102 through elastic deformable means 120.

In the embodiment shown on 3, the elastic deformable means 120 comprise a folded spring 120. The folded spring comprises n spring arms, n≥2. The shape of the folded spring is similar to that of the embodiment shown in FIG. 2A. The longitudinal end 116.2 of the beam opposite to that one hinged on the substrate is connected to an intermediate area of one spring arm; the intermediate area is located between the longitudinal ends of the spring arms.

Very advantageously, the beam 116 is also anchored to the substrate through additional elastic deformation means, for example a folded spring 122. In the embodiment shown the folded spring 122 comprises one spring arm. The folded spring 120 and the folded spring 122 are both connected to the same longitudinal end 116.2 of the beam 116. The anchorage of the folded spring 122 to the substrate allows the mass to move out-of-plane and avoid in-plane motion of the mass.

In the embodiment shown, the longitudinal end 116.1 of the beam comprises, on each lateral side, a projection 128 to which the gauge and the torsional beam of the pivot hinge 117 are connected.

The pivot hinge 117 comprises two beams 124 which are able to be deformed in torsion about X-axis. Each beam 124 is connected to a projection 128 and to anchorage pad 126. The beams 124 are aligned along a direction X1 parallel to X-axis, X1-axis being the pivot axis of the beam with respect to the substrate.

Each gauge is orientated perpendicular to the pivot axis X1 and one gauge is on one side of the X1-axis and the other gauge is located on the other side of X1-axis. It results that when the rigid beam rotates about X1-axis, one gauge is submitted to tensile strength and one gauge is submitted to compressive stress, providing a differential measurement.

Figure 5A:
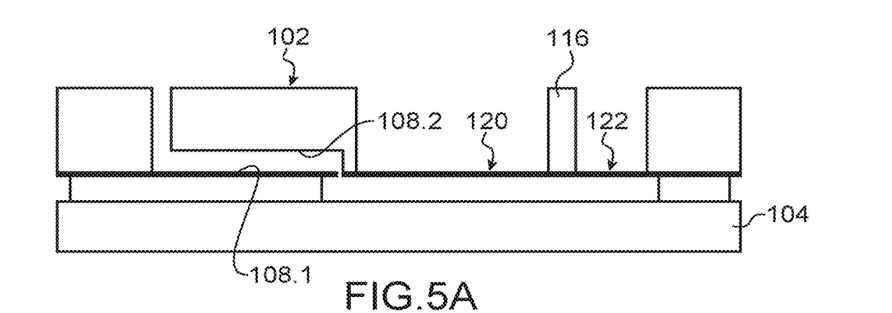
FIGS. 5A and 5B is a sectional view of the resonator of FIG. 4 in rest state and in vibrating state respectively along plane A-A.
Figure 5B:
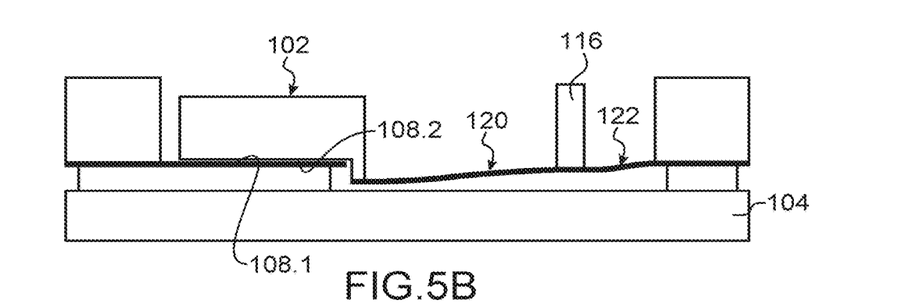

Sectional views of the resonator of FIG. 4 in rest state and in vibrating state are shown on FIGS. 5A and 5B respectively.

When the actuating means are operated, the mass is moved towards the substrate and the motion of the mass is transmitted through the folded spring 120 to the longitudinal end 116.2 of the rigid beam 116 which is also moved toward the substrate. The rigid beam 116 rotates about X1-axis, but the displacement of the rigid beam 116 is smaller than the displacement of the mass 102 as it is shown on FIG. 5B. It results that the elongation and compression of the gauges are reduced in comparison with the gauges in out-of plane resonators of the prior art.

The reduction of the displacement of the beam also depends on the number of spring arms n.

Figure 6A:
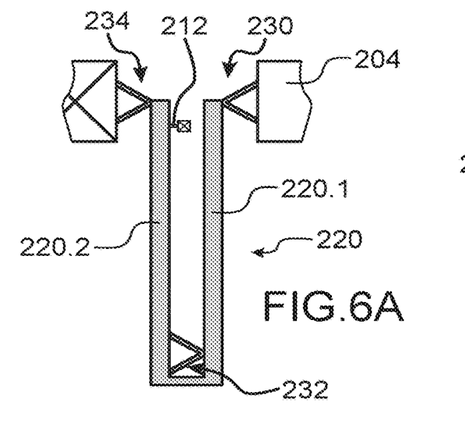
FIGS. 6A and 6B are schematic view of another example of the piezoresistive detection means.
Figure 6B:
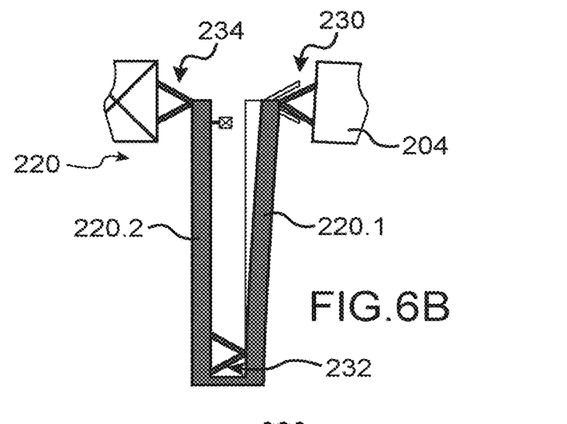

In FIGS. 6A and 6B, another example of piezoresistive detection means 210 is shown.

The elastic deformable means 220 comprise a folded spring with a first and a second spring arms 220.1, 220.2. A first spring arm 220.1 is connected at one longitudinal end to the mass 204 through a pivot link 230 and is hinged to the substrate through another pivot link 232 at its other longitudinal end of the spring arm 220.1, the other longitudinal end of the first spring arm 220.1 being connected to the second spring arm 220.2. The second spring arm 220.2 is connected to the substrate through a pivot link 234 at a longitudinal end opposite to that connected to the first spring arm 220.1.

In the embodiment shown, a strain gauge 212 is suspended between a lateral side of the second spring arm 220.2 and to a substrate near the pivot link 234. The strain gauge extends along the motion direction of the mass.

In FIG. 6B, the folded spring is deformed by the vibration of the mass. It can be seen that the motion of the second spring arm is greatly reduced compared to the motion of the first spring arm connected to the mass.

The folded spring 220 may have more than two arms.

The constraint applied to the gauge depends on the location of the gauge with respect to the pivot link and the location of the pivot link along the second spring arm. The stress is mainly localized on the gauge.

A differential measurement may be achieved by suspending a second gauge between the second spring arm and the substrate, but at a location opposite to the gauge with respect to a plane passing through the pivot link 234 and parallel to X-axis direction, in such manner that, when the second spring arm rotate about the axis of the pivot hinge 234, one gauge is compressed and one gauge is extended.

As a variant, the resonator comprises a second folded spring 220 connected to the substrate at a side of the mass opposite to the side to which the first folded spring 220 is attached. A differential readout is provided by the outputs delivered by the gauge connected to the first folded spring and the gauge connected to the second folded spring.

Figure 7A:
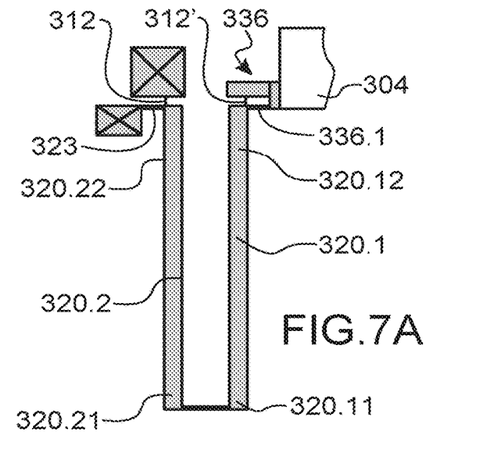
FIGS. 7A and 7B are schematic view of another example of the piezoresistive detection means.
Figure 7B:
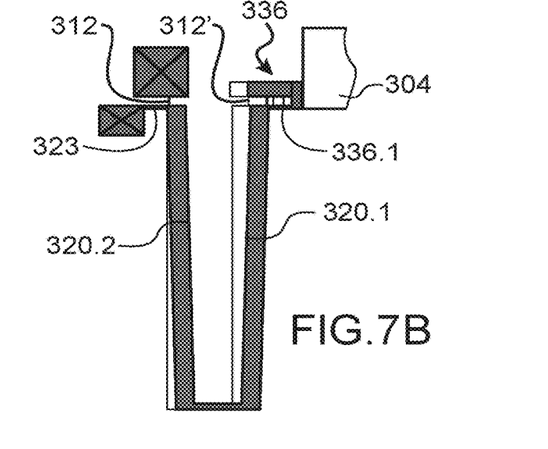

FIGS. 7A and 7B show another embodiment of elastic deformable means 320 that can be implemented in the invention.

The elastic deformable means 320 comprise a folded spring with two approximately parallel spring arms 320.1, 320.2. One longitudinal end 320.11 of the first spring arm 320.1 is connected to one longitudinal end 320.21 of the second spring arm 320.2. The second longitudinal end 320.22 of the second spring 320.2 is connected to the substrate through a spring 323 and to a first gauge 312 which is connected to the substrate.

The first gauge 312 provides measurement to determinate the motion of the mass. In this embodiment, the gauge 312 extended approximately along the longitudinal direction of the first spring arm 320.1 and is perpendicular to the motion direction of the mass.

The folded spring 320 also comprises a first U-shaped part 336. One branch 336.1 of the U is a small spring which is attached to the other longitudinal end 320.12 of the first spring arm 320.1. The opposite branch 336.2 of the U is stiff. A second gauge 312' is advantageously suspended between the two opposite branches 336.1, 336.2 of the U-shaped part 336. The bottom 336.3 of the U connecting the two branches 336.1, 336.2 is attached to the mass 304. The second gauge 312' improves the symmetry of the structure, but output of the first gauge 312 can be sufficient for the readout of the movement.

In FIG. 7B, the folded spring is deformed by the vibration of the mass. It can be seen that the motion of the second spring arm is greatly reduced with respect to the motion of the first spring arm connected to the mass.

The stress is localized only on the gauge 312.

A differential readout is obtained for example with the use of a second folded spring attached to the opposite side of the mass.

This embodiment is compact and presents a good linearity of the gauge stress.

The folded spring 320 may have more than two arms.

Figure 8A:
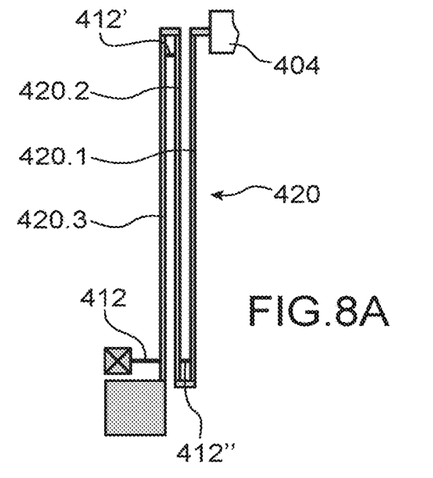
FIGS. 8A and 8B are schematic view of another example of the piezoresistive detection means.
Figure 8B:
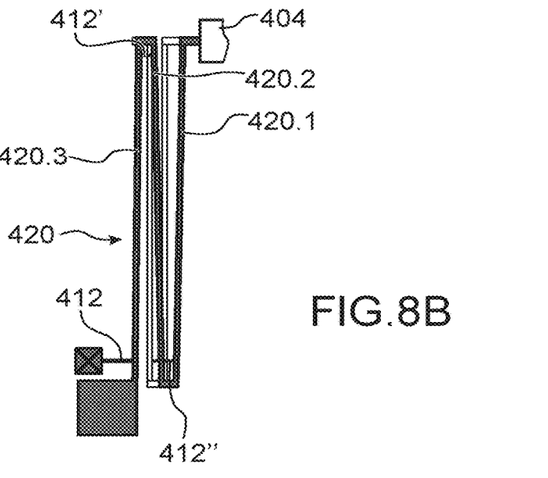

FIGS. 8A and 8B show another embodiment of elastic deformable means 420 that can be implemented in the invention The elastic deformable means 420 comprises a folded spring which comprises three spring arms 420.1, 420.2 and 420.3. The spring arms are approximately parallel. The first spring arm 420.3 is attached to the substrate at one longitudinal end. The third spring arm 420.1 is connected directly to the mass 404 and the second spring arm 420.2 is connected to the first spring arm 420.1 and the third spring arm 420.3.

A first gauge 412 is suspended between the first spring arm 420.3 and the substrate. This output of this first gauge 412 is used for the readout of the measurement.

Advantageously a second gauge 412' is suspended between the first spring arm 420.3 and the second spring arm 420.2 and a third gauge 412" is suspended between the second spring arm 420.2 and the third spring arm 420.1. The second and third gauges 412', 412" are approximately perpendicular to the motion direction of the mass in the example shown. The second and third gauges 412', 412" help to have a uniform distribution of the stress along the whole spring system.

In FIG. 8B, the folded spring is deformed by the vibration of the mass. It can be seen that the motion of the second spring arm is greatly reduced with respect to the motion of the first spring arm connected to the mass.

The stress is localized only on the gauge.

The folded spring 420 may have more or less than three spring arms.

The embodiment offers compactness and is simple to achieve.

Figure 11:
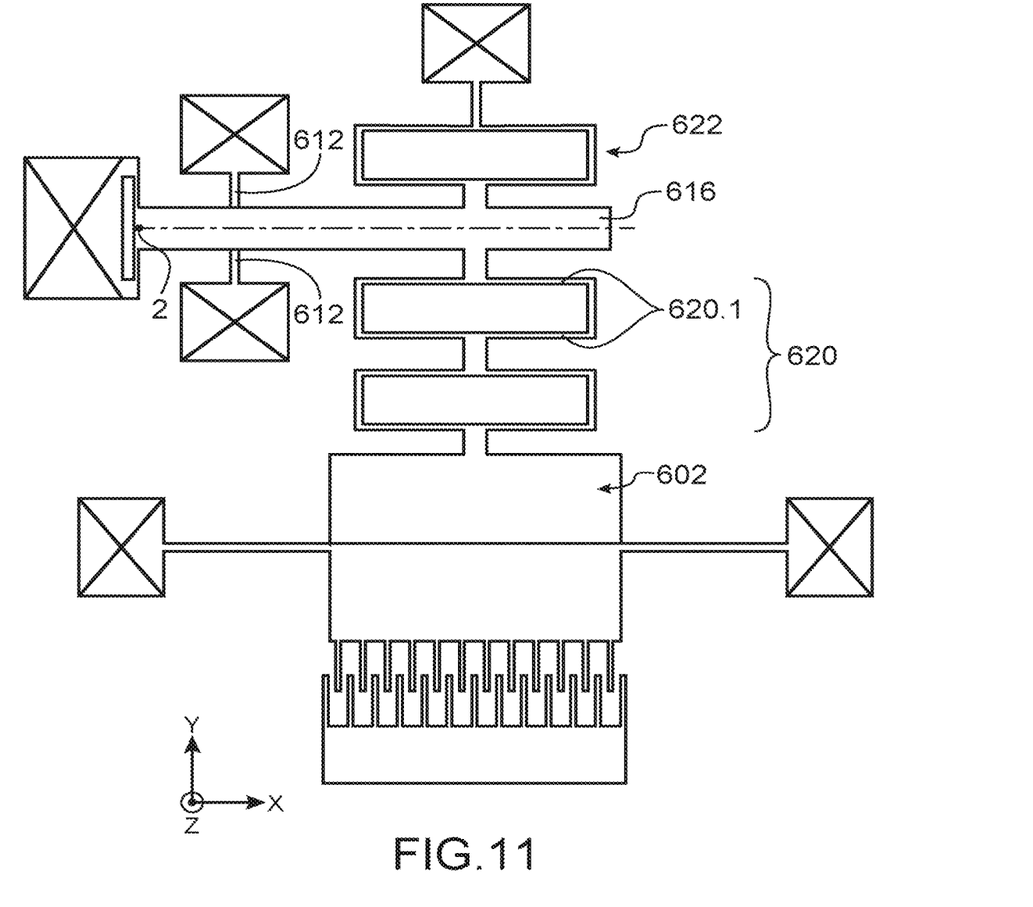
FIG. 11 is schematic view of another embodiment of a resonator.

In FIG. 11, another embodiment is shown. The structure of the resonator is very close to the structure of resonator of FIG. 2A, but the elastic deformable means 620 are formed by arms deformed in flexure. Arms 620.1 are connected to each other such that when the mass 602 moves along Y-axis the arms 620.1 deform in flexure along Y-axis. The motion of the beam 616 is reduced compared to the motion of the mass and the gauges 612 are protected. The elastic deformable means 620 have a greater stiffness than that of the folded spring. Advantageously, additional elastic deformable means 622 anchored the beam 616 to the substrate avoiding out-of-plane motion of the mass 602.

Figure 9A:
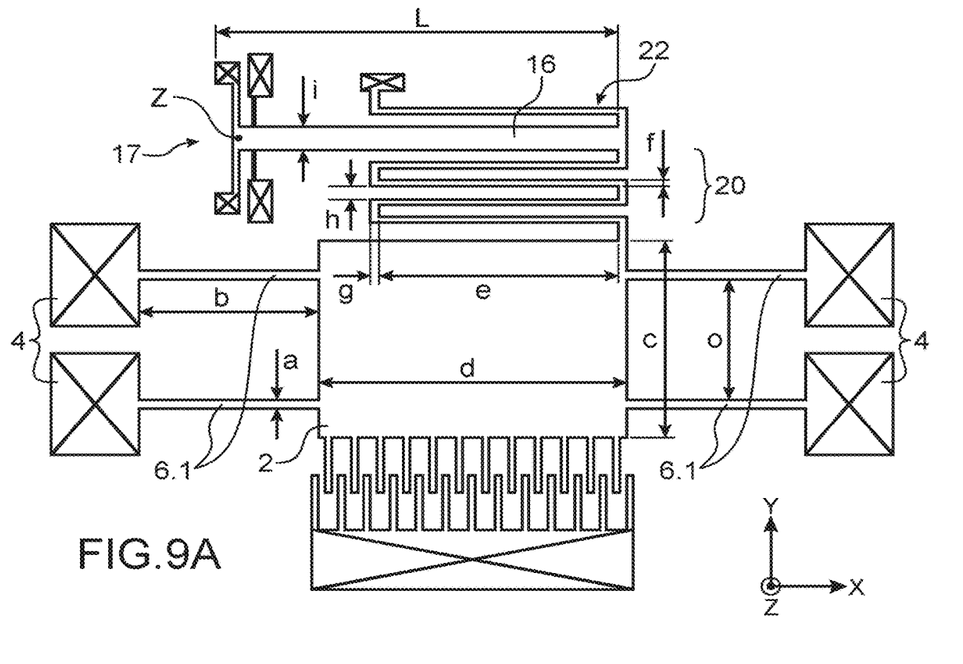
FIGS. 9A and 9B are the FIGS. 2A and 2B with dimensional references.
Figure 9B:
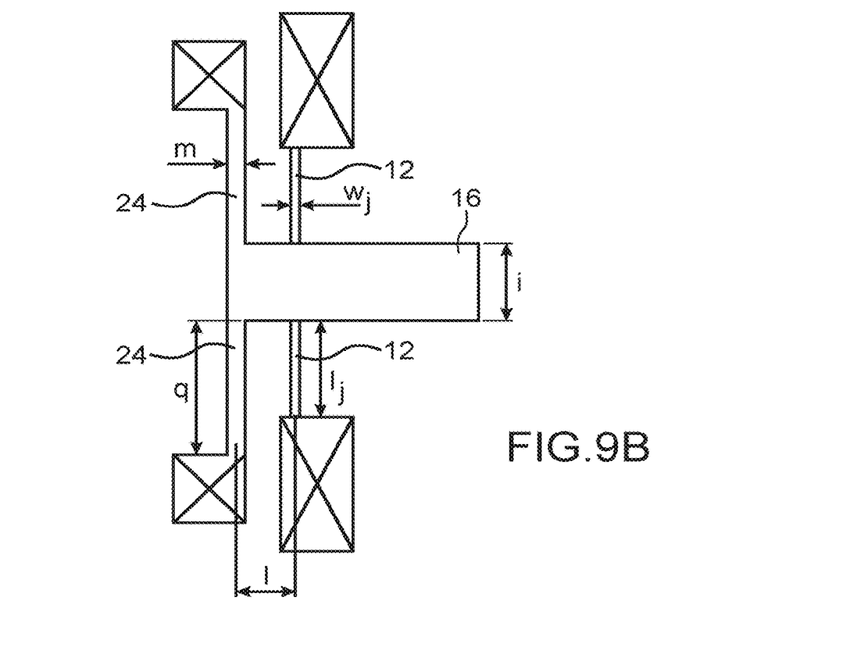

The calculation of the displacement of the end of the rigid beam of the embodiment of FIGS. 2A and 2B will now be detailed. FIGS. 9A and 9B show the embodiment of FIGS. 2A and 2B with dimensional references used for the calculation. For the calculation, the resonator is in silicon.

$k_1$: stiffness of the assembly mass and suspension means,
$k_2$: stiffness of one spring arm,
$k_3$: stiffness of the pivot link—gauges—rigid beam system,
$k_f$: stiffness of the folded spring 20,
E: Young modulus of the silicon,
$t_M$: thickness of the MEMS part,
$t_N$: thickness of the NEMS part.

The expressions of the different stiffness are:

$$k_1 = \frac{4Ea^3 t_M}{b^3}$$

$$k_2 = \frac{Ef^3 t_M}{e^3}$$

$$k_f = \frac{k_2}{n}$$

The rotational stiffness of the pivot link-gauge system is given by:

$$C = 2\left[\frac{Et_M m}{q} \cdot \frac{m^2}{3}\left(1 + 3\left(\frac{i}{2q}\right) + 3\left(\frac{i}{2q}\right)^2\right) + \frac{Et_N \omega_J}{l_J} \cdot \frac{\omega_J^2}{3}\left(1 + 3\left(\frac{i}{2l_J}\right) + 3\left(\frac{i}{2l_J}\right)^2\right) + \frac{Et_N \omega_J}{l_J} l^2\right]$$

And the stiffness of the rigid beam 16 is:

$$k_4 = \frac{Ei^3 t_M}{4L^3}$$

The total stiffness of the system including the rigid beam and the pivot link and gauges system is given by:

$$k_3 = \frac{C}{L^2} + k_4$$

Finally, the total stiffness of the resonator can be expressed as $$k_{tot} = \frac{1}{\frac{n}{k_2} + \frac{1}{k_2 + k_3}} + k_1$$

We can see that the expression of the total thickness is a combination of the assembly mass and suspension means and of the detection means.

Considering the force balancing at the two ends of the folded spring, we can write:

$$F = \frac{\delta x_1}{\frac{n}{k_2} + \frac{1}{k_2 + k_3}} = (k_2 + k_3)\delta x_2$$

Where $\delta x_1$ is the displacement of the mass obtained with the electrostatic actuation and $\delta x_2$ is the displacement at the end of the rigid beam attached to the folded spring.

Then, the displacement at the end of the rigid beam 16 is $$\delta x_2 = \frac{\delta x_1}{n\frac{k_2+k_3}{k_2}+1}$$

We see from this expression that thanks to the invention by appropriately choosing the values of n, $k_2$ and $k_3$, the displacement of the rigid beam can be greatly reduced compared to the displacement of the mass. For example, if $k2 \approx k3$, $$\delta x_2 = \frac{\delta x_1}{2n+1}$$

The gauge displacement will now be calculated:
The displacement $\delta x_2$ at the extremity of the rigid beam is the sum of the displacement $L\theta$ considering the rigid beam as infinitely stiff and of the bending $\delta x_b$ of the rigid beam:

$$\delta x_2 = \delta x_b + L\theta$$

Yet: $k_4 \delta x_b = \frac{C\theta}{L}$

Then: $\theta = \frac{\delta x_2}{L + \frac{C}{k_4 L}}$

The elongation of the gauge $I_j$ in length is given by:

$$\varepsilon = \frac{l\theta}{l_j},$$

$I_j$ is shown on FIG. 9B.
And the stress σ in the gauge is:

σ=Eε

As non limited example a numerical application is given:

| | | | |
|---|---|---|---|
| Young modulus | E | 169 | GPa |
| MEMS thickness | $t_M$ | 20 | μm |
| NEMS thickness | $t_N$ | 0.25 | μm |
| Silicon density | ρ | 2330 | kg/m3 |
| Suspension beam of the mass | a | 1.4 | μm |
| | b | 50 | μm |
| Distance between the suspension beam of the mass | o | 50 | μm |
| Dimensions of the resonator mass | c | 640 | μm |
| | d | 640 | μm |
| Rigid beam | L | 291 | μm |
| | i | 15 | μm |
| Suspension beam of the rigid beam | m | 3 | μm |
| | q | 20 | μm |
| Pivot-gauge distance | l | 8.625 | μm |
| Gauge dimensions | $l_j$ | 5 | μm |
| | $w_j$ | 0.25 | μm |
| Folded spring | e | 161 | μm |
| | f | 4 | μm |
| | g | 10 | μm |
| | h | 10 | μm |
| | n | | |
| Displacement of the resonator mass | $\delta x_1$ | 3 | μm |
| Stiffness of the resonator suspension beams | k1 | 296.8 | N/m |
| Stiffness of a spring arm of the folded spring | k2 | 51.8 | N/m |
| Stiffness of one gauge | kJ | 2112.5 | N/m |
| Rotational stiffness of the pivot gauge system | C | $8.063 \cdot 10^{-6}$ | N · m |
| Stiffness of the pivot - gauges - rigid beam system | k3 | 52.2 | N/m |
| Total stiffness of the system | $k_{tot}$ | 305.2 | N/m |
| Mass | M | 19.09 | μg |
| Fundamental resonance pulsation | w | 126454 | rd/s |
| Fundamental resonance frequency | f | 20126 | Hz |
| Displacement of the end of the rigid beam | δx2 | 0.332 | μm |
| Gauge elongation | dlj/lj | 1.08E−03 | |
| Stress in the gauge | σ | 183 | MPa |

Figure 10A:
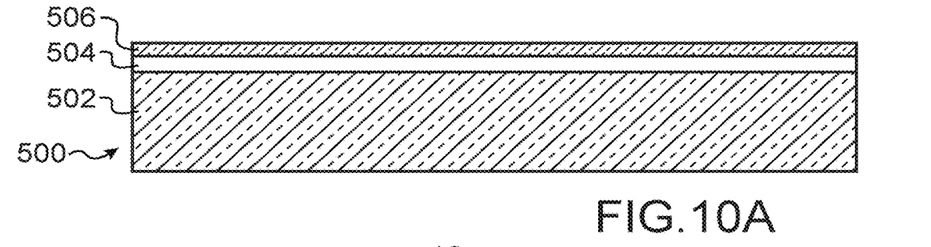
FIGS. 10A to 10H are schematic representations of steps of an example of a process for manufacturing a resonator of the invention.

An example of a process for manufacturing a resonator of the invention will be now described:

The process is made on a SOI substrate 500 shown on FIG. 10A which comprises a silicon substrate 502, an oxide layer 504 and a superficial silicon layer 506, the thickness of which can be 250 nm and the thickness of the buried oxide can be 1 μm or 2 μm.

The superficial silicon layer 506 will be the material of the nanogauge. This layer is implanted with Boron for example. Preferably the doping level is chosen to have the targeted piezoresistive coefficient. For example, a dose of 5E15 at/cm². homogenized along a silicon thickness of 250 nm with a convenient annealing leads to a volume concentration of 5E19 at/cm3 and a gauge factor around 50.

Figure 10B:
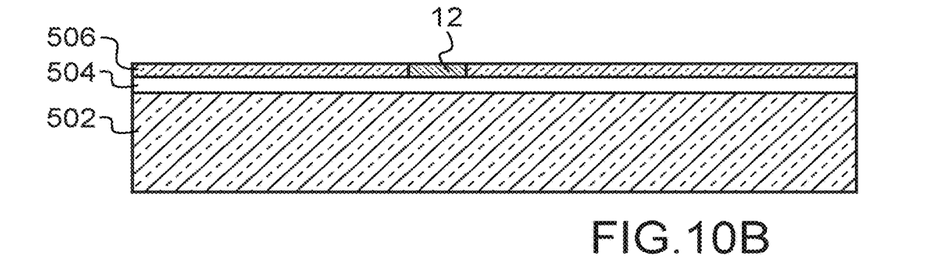

In a subsequent step, one or several gauges 12 are made in the layer 506. For example a lithography on the superficial layer to define the dimensions and the location of the gauge(s) is made and then the layer 506 is etched, for example by plasma dry etching process.

The element which is obtained is shown on FIG. 10B.

Figure 10C:
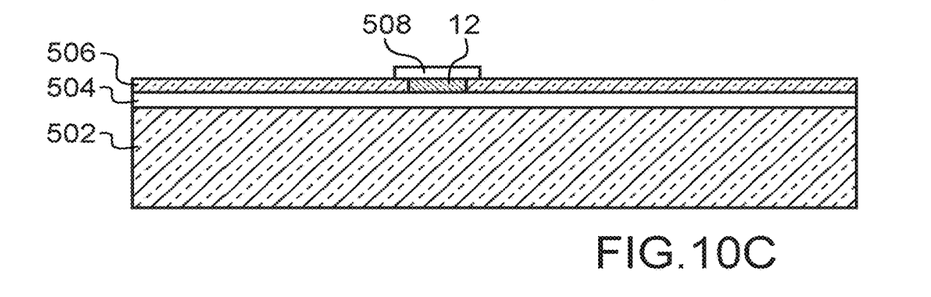

In a subsequent step a protective layer 508 is formed on the gauge(s), for example the protective layer is silicone dioxide, and it is for example deposited on the gauge(s).

The element which is obtained is shown on FIG. 10C.

Figure 10D:
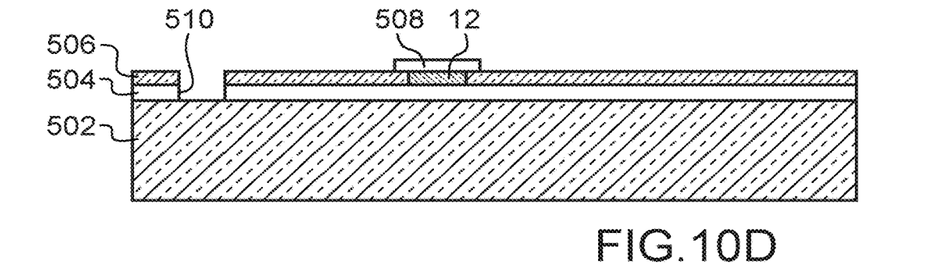

In a subsequent step, the silicon layer 506 and the dioxide layer 504 are structured to provide an access 510 to the substrate, for example by etching.

The element which is obtained is shown on FIG. 10D.

Figure 10E:
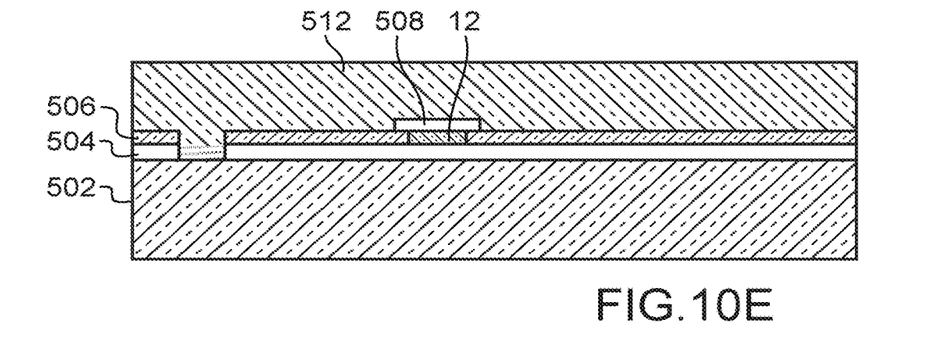

During a subsequent step, a thick monocrystalline silicon layer 512 is formed on the front face of the element of FIG. 10D. The layer 512 is for example grown, for example through a non-selective epitaxial process, i.e. the growth takes place both on the silicon dioxide and the silicon. Thickness of layer 512 is comprises between 1 μm to several tens of μm, and is equal to 20 μm for example.

The element which is obtained is shown on FIG. 10E.

Figure 10F:
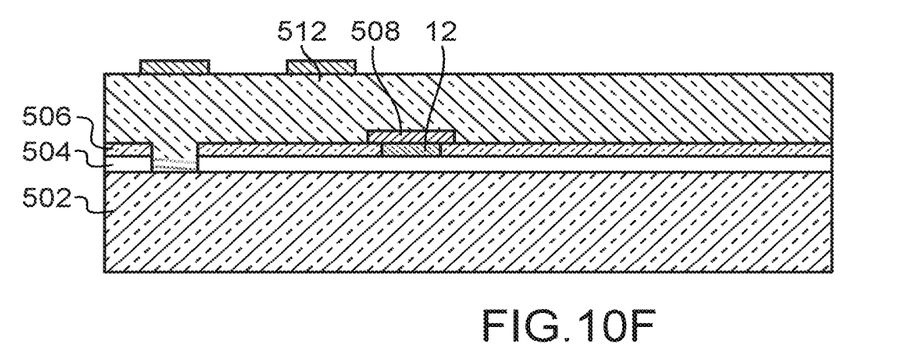

In a subsequent step, electrical contacts 513 are made. For example a metallic layer 514, for example in AlSi material, is formed on the front face of the element of FIG. 10E, for example it is deposited. The layer 514 is then structured.

The element which is obtained is shown on FIG. 10F.

Figure 10G:
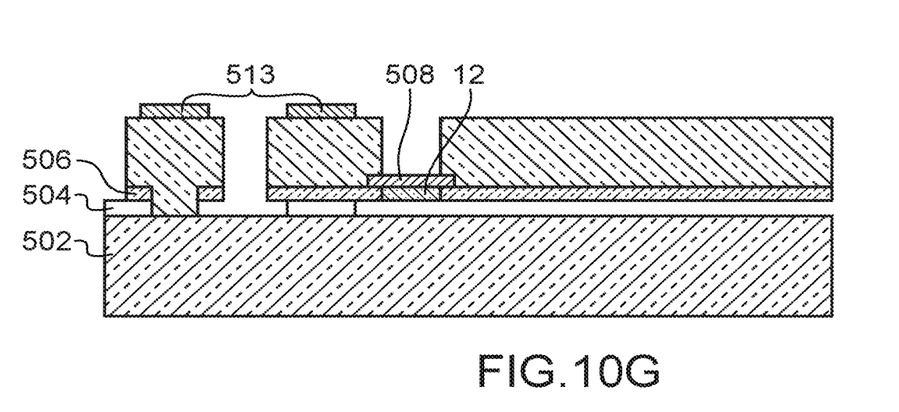

In a subsequent step, the element of FIG. 10F is structured to define the mechanical structure in layer 512. For example, a deep reactive etching is performed to layer 512. Thanks to the protective layer 508, gauges are protected from etching.

The element which is obtained is shown on FIG. 10G.

Figure 10H:
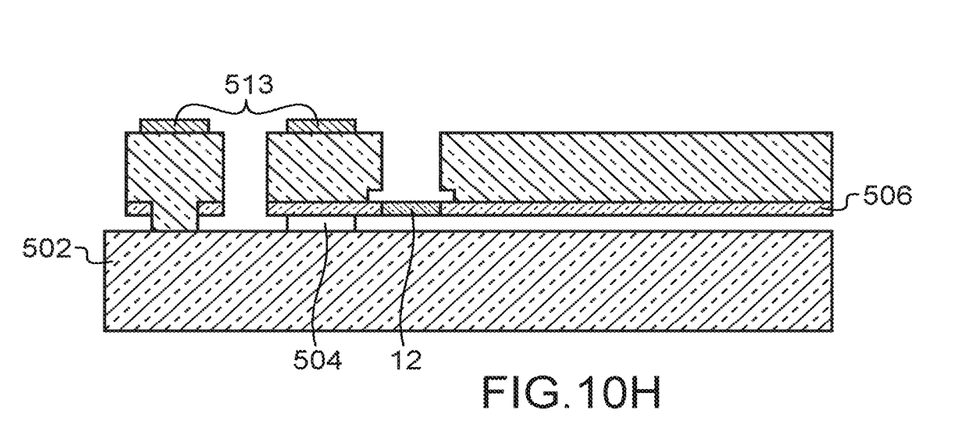

In a subsequent step, the movable parts of the structure are released, for example by etching of the layer 504 using a vapor HF or diluted liquid HF.

The element which is obtained is shown on FIG. 10H.

Thanks to the invention, piezoresistive detection can be implemented without damaging the gauge.

Besides the piezoresistive detection resonator offers a good linearity of the gauge stress.

In addition, the piezoresistive detection resonator of the invention offers low power consumption. Indeed power is consumed both in the drive section, to keep the resonator in oscillation, and in the detecting section, to read out output signals. In the case of a gyrometer, the output signal is proportional to the angular rate the system is subject to.

The use of piezoresistive elements as means to detect the displacement performed by the frame that provides the actuation has the advantage of providing a signal at the drive-detection port which is larger than for typical capacitive readout implementations, without requiring large voltages and associated circuits (e.g. charge pumps) which can dissipate power consumption.

As estimation, the output signal from the gauges can be a factor 10 to 100 larger than the output signal of capacity detection means. The oscillating circuit can therefore dissipate a lower power consumption than in capacitive devices, e.g. because of the lower required gain to saturate the oscillation.

Further, the resistive readout is quite immune from effects of parasitic capacitances, also called parasitic feedthrough capacitance, between the drive-actuation and the drive-detection ports. As a direct consequence, the minimization of effects from feedthrough capacitances avoids the need for electronic low-pass stages, which consumes current and whose poles lie too close to the transfer function peak. As well-known by the person skilled in the art, this would generate unwanted phase shifts close to resonance which degrade the oscillator performance.

With a low consumption issue, the resonator according to the invention is well adapted to wireless devices, for example for gyroscope for consumer application.

It is specifically adapted for wireless devices for which the battery replacement is complex, for example in medical applications for which a surgery may be required for replacing battery. The lifetime of the device is then increased.

Besides the use of miniaturized sensing elements like piezoresistive gauges enables, on the whole, an advantageous miniaturization of the system.

The invention claimed is:

1. A piezoresistive detection resonant device comprising:
   a substrate,
   a mobile part configured to move with respect to the substrate,
   at least one suspension element directly connected to the mobile part, directly connected to the substrate, and suspending the mobile part from the substrate,
   a piezoresistive detection device to detect motion of the mobile part,
   said piezoresistive detection device comprising
   at least one strain gauge,
   at least one first spring connected to the mobile part and configured to be deformed by the motion of the mobile part, the at least one first spring comprising a folded spring having n spring arms, n≥1, and
   a rigid beam extending longitudinally in a first direction and connected to the at least one strain gauge and the at least one first spring, a longest side of the rigid beam extending in the first direction, wherein
   in response to a component of motion of the mobile part in a second direction perpendicular to the longest side of the rigid beam, said at least one first spring is configured to deform and, during the deformation, cause rotation of the rigid beam around an axis,
   wherein the at least one strain gauge is directly connected to the rigid beam and to the substrate and the at least one first spring is directly connected to the rigid beam.

2. The piezoresistive detection resonant device according to claim 1, wherein the at least one strain gauge is directly connected to the substrate.

3. The piezoresistive detection resonant device according to claim 1, wherein the mobile part is configured to move in a plane of the piezoresistive detection resonant device, the rigid beam being configured to rotate in a direction perpendicular to the plane of the piezoresistive detection resonant device.

4. The piezoresistive detection resonant device according to claim 3, comprising at least one second spring connected to the rigid beam and to the substrate, the at least one second spring limiting out-of-plane motions of the rigid beam.

5. The piezoresistive detection resonant device according to claim 1, comprising at least two strain gauges connected in such manner that a differential measurement of the motion of the mobile part is obtained.

6. The piezoresistive detection resonant device according to claim 1, comprising at least one actuator for actuating the mobile part.

7. The piezoresistive detection resonant device according to claim 6, the at least one actuator comprises an electrostatic actuator, a thermal actuator, a magnetic actuator or a piezoresistive actuator.

8. An accelerometer comprising at least one piezoresistive detection resonant device according to claim 1.

9. A gyrometer comprising at least one piezoresistive detection resonant device according to claim 1.

10. The piezoresistive detection resonant device according to claim 1, wherein the at least one strain gauge is directly connected to a first end of the rigid beam in the first direction and the at least one first spring is directly connected to a second end of the rigid beam opposite to the first end in the first direction.

* * * * *